United States Patent [19]

Sampei et al.

[11] 4,422,109
[45] Dec. 20, 1983

[54] MAGNETIC RECORDING AND REPRODUCING APPARATUS AUTOMATICALLY ADJUSTABLE TO EACH INDIVIDUAL MAGNETIC TAPE

[75] Inventors: Tohru Sampei; Naoya Fujita; Shigemitsu Higuchi; Masamichi Yamada, all of Yokohama; Kohichi Tomatsuri, Katsuta, all of Japan

[73] Assignee: Hitachi, Ltd., Tokyo, Japan

[21] Appl. No.: 390,884

[22] Filed: Jun. 22, 1982

Related U.S. Application Data

[63] Continuation of Ser. No. 79,162, Sep. 26, 1979.

[30] Foreign Application Priority Data

Sep. 27, 1978 [JP] Japan .................................. 53-117901
Sep. 27, 1978 [JP] Japan .................................. 53-117902
Sep. 27, 1978 [JP] Japan .................................. 53-117928
Sep. 27, 1978 [JP] Japan .................................. 53-117932

[51] Int. Cl.³ .......................... G11B 5/45; G11B 5/47
[52] U.S. Cl. ......................................... 360/65; 360/66
[58] Field of Search ....................... 360/31, 25, 65, 66

[56] References Cited

U.S. PATENT DOCUMENTS

4,011,585  3/1977  Sunaga .................................. 360/65
4,038,692  7/1977  Umeda .................................. 360/65

Primary Examiner—Vincent P. Canney
Attorney, Agent, or Firm—Antonelli, Terry & Wands

[57] ABSTRACT

A magnetic recording and reproducing apparatus comprises a source for producing test signals, a variable-gain amplifier, an equalizer, a recording bias generating circuit, a control unit for supplying control signals to the amplifier, equalizer and recording bias generating circuit, a memory and an operating circuit unit. The apparatus is automatically adjusted to each individual magnetic tape in use in such a manner that: a first test signal from the source is recorded on a magnetic tape with a preset bias control signal, the recorded first test signal is reproduced, the bias control signal is adjusted to provide a maximum HF saturation level and a minimum distortion to thereby determine an optimum bias control signal, and the proper bias control signal is fixed for said bias generating circuit; another test signal from the source is recorded on the magnetic tape with a preset gain control signal, the recorded other test signal is reproduced and is compared with a reference value at the operating circuit unit to provide an error signal, and the resulting error signal is fed through the memory to the control unit to renew the preset gain control signal for said amplifier. The adjustment of the frequency response control signal for the equalizer is effected in the same manner as the adjustment of the gain control signal.

39 Claims, 18 Drawing Figures

MAGNETIC RECORDING AND REPRODUCING APPARATUS AUTOMATICALLY ADJUSTABLE TO EACH INDIVIDUAL MAGNETIC TAPE

This is a continuation of application Ser. No. 079,162, filed Sept. 26, 1979.

BACKGROUND OF THE INVENTION

This invention relates generally to magnetic recording and reproducing apparatus, and more particularly to a magnetic recording and reproducing apparatus of the kind which is automatically adjustable to the proper recording conditions which vary depending on the characteristics of magnetic tapes used for recording.

A conventional magnetic recording and reproducing apparatus of this kind such as a tape deck comprises a plurality of circuit units connected to associated contacts of a change-over switch for the purpose of varying the frequency response of the apparatus and the bias current produced in the apparatus depending on the type or the material of a magnetic tape used for recording. This is because, as is well known to those skilled in the art, magnetic tapes now in use are broadly classified into normal tapes, $CrO_2$ tapes, Fe-Cr tapes and alloy tapes depending on the kind of the material, and they differ from one another in the recording conditions including the sensitivity, the frequency response and the optimum bias current. Further, even in the magnetic tapes of the same type or the same material, it is not unusual that the aforementioned recording conditions differ from one another depending on the production lot, the maker or the brand. Therefore, in order that the peculiar performance of each individual magnetic tape in use can be fully exhibited, recording must be done at the proper recording conditions for that specific magnetic tape, in addition to the consideration of the kind of the material thereof. Otherwise, the desired flatness of the frequency response during recording and reproduction will not be obtained, and the reproduction of sound with high fidelity will not be achieved.

SUMMARY OF THE INVENTION

It is a primary object of the present invention to provide a novel and improved magnetic recording and reproducing apparatus which is automatically adjustable to the proper recording conditions for each individual magnetic tape used for recording.

In the present invention, the optimum recording bias for a magnetic tape used for recording is initially automatically set, and the proper recording frequency response compensation complying with the optimum recording bias thus set is then automatically determined so that the magnetic recording and reproducing apparatus can be automatically adjusted to the proper recording conditions, for the specific magnetic tape.

Further, in order that the presence of the leader tape portion in the magnetic tape or the tendency of instable travelling movement of the magnetic tape in the initial stage of travelling movement may not spoil the adjusting cycle, the magnetic recording and reproducing apparatus according to the present invention may comprise a timer circuit or a reproduced signal detection circuit so that the aforementioned automatic adjustment may not be started until a predetermined length of time lapses after the manipulation of a switch, a button or the like used for starting the operation of the apparatus.

Furthermore, in order to deal with the user's requirement for hurried recording, the magnetic recording and reproducing apparatus may comprise a ROM storing previously the information of standard or mean recording conditions, so that the required recording can be carried out under control of a set of control signals applied from this ROM.

DESCRIPTION OF THE PREFERRED EMBODIMENTS

Before describing the present invention in detail, one practical form of part of the aforementioned prior art magnetic recording and reproducing apparatus will be briefly described with reference to FIGS. 1 to 4, so that the present invention can be more clearly understood.

Figure 1:
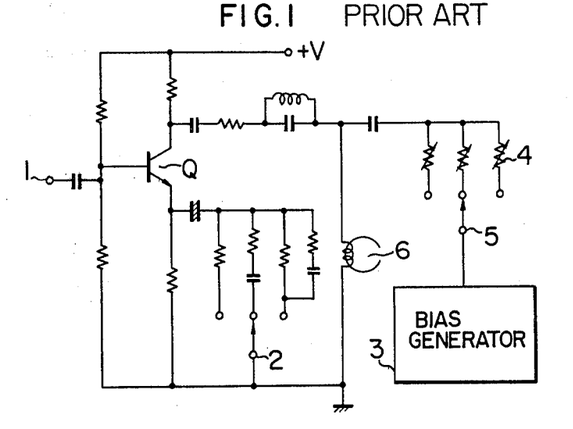
FIG. 1 is a circuit diagram showing, by way of example, the structure of a circuit portion including a transistor amplifier and a bias generator in a prior art magnetic recording and reproducing apparatus.

Referring to FIG. 1, the illustrated portion of the prior art magnetic recording and reproducing apparatus includes an input terminal 1, a selection switch 2, a bias generator 3, a plurality of variable resistors 4, another selection switch 5, a recording head 6 and an amplifying transistor. Prior to starting the recording operation of the magnetic recording and reproducing apparatus, one of a plurality of (or three herein) time constant circuits 10 connected in common to the emitter circuit of the transistor amplifier Q is selected by the selection switch 2 depending on the kind of the material of a magnetic tape used for recording, that is, depending on whether the magnetic tape is of the normal type, $CrO_2$ type, Fe-Cr type or alloy type. The selection of the desired one of the time constant circuits by the selection switch 2 establishes the recording frequency response compensation for the specific magnetic tape. Then, a suitable one of the variable resistors 4 is similarly selected by the selection switch 5 to adjust the bias current supplied from the bias generator 3 thereby determining the optimum recording bias for the specific magnetic tape.

Figure 2:
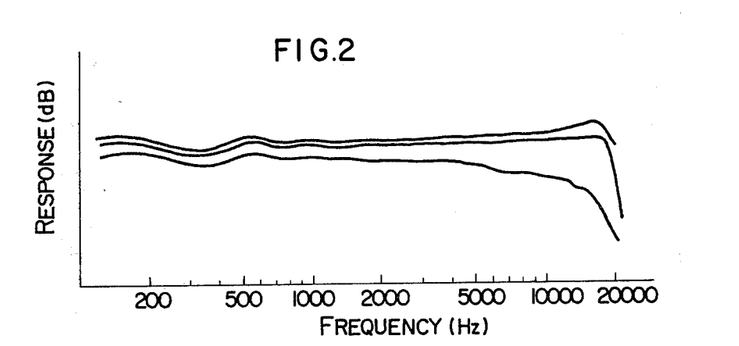
FIG. 2 shows the frequency response of three magnetic tapes of the same type.

Actually, however, even magnetic tapes of the same type available on the market differ from one another in the frequency response. For example, FIG. 2 shows a frequency response of three magnetic tapes of the normal type available on the market. It will be seen from FIG. 2 that the frequency response differs considerably from one another, and the prior art manner of changing over the recording frequency response compensation simply over the three or four stages is unable to flatten the frequency response of a variety of magnetic tapes.

Figure 3:
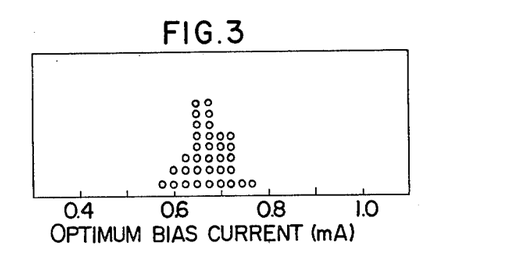
FIG. 3 shows the distribution of the optimum bias current for thirty-four magnetic tapes of the normal type.
Figure 4:
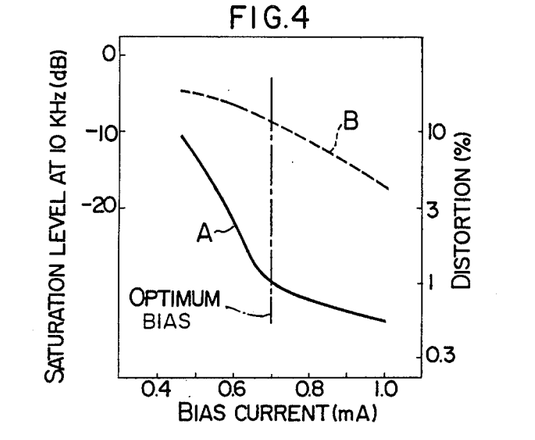
FIG. 4 shows the variation in the saturation level of a magnetic tape and the variation in the distortion relative to the bias current.

Further, as shown in FIG. 3, the optimum recording bias current for magnetic tapes of the same type differs also considerably from one another. FIG. 3 illustrates how the optimum recording bias current for thirty-four normal tapes differs from one another depending on the maker, and it will be seen that the optimum recording bias current fluctuates over a considerably wide range of $\pm 15\%$. It is well known that the result of recording and reproduction by a magnetic recording and reproducing apparatus will be greatly adversely affected unless the recording bias current for a magnetic tape used for recording is set at the optimum value. FIG. 4 illustrates how the distortion A and the saturation level B at a high frequency of 10 kHz vary relative to the bias current. It will be seen from FIG. 4 that, with the increase in the bias current value, the distortion is reduced as shown by the solid curve A, but, on the other hand, the saturation level at the high frequency of 10 kHz is lowered as shown by the dotted curve B resulting in a narrower dynamic range. In FIG. 4, the bias current is optimum when the distortion is about 1% and the saturation level is about $-10$ dB. Thus, at least one of the distortion and the saturation level will be deteriorated when a magnetic tape used for recording is of the type or brand which differs from that of a magnetic tape having been properly adjusted in the course of manufacture.

Figure 5:
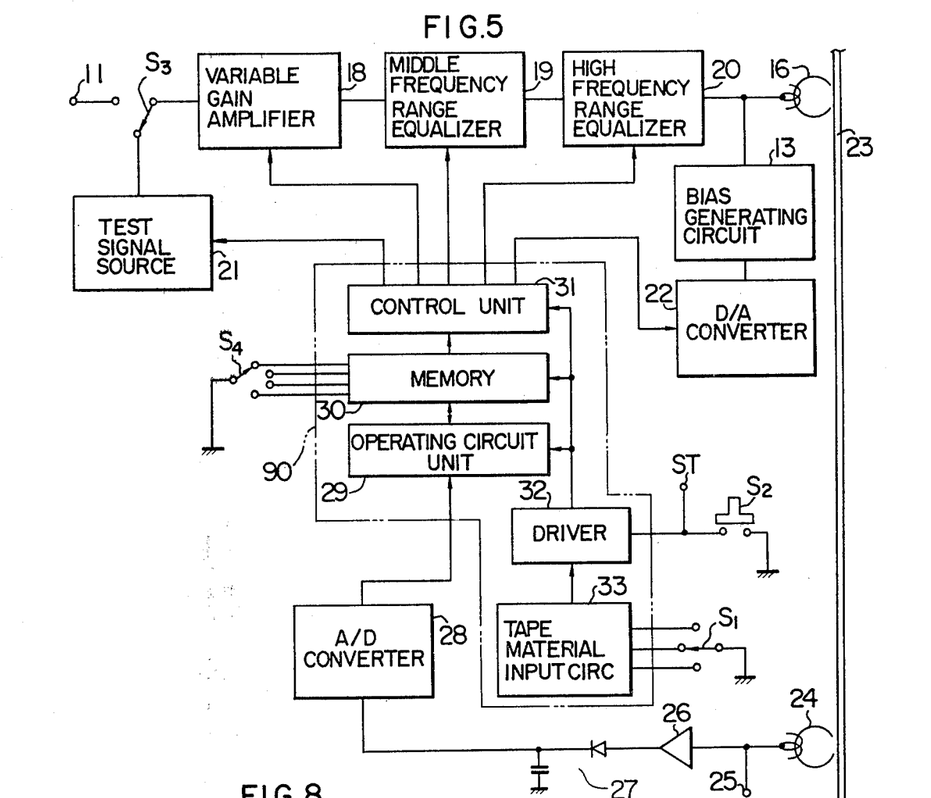
FIG. 5 is a block diagram of a preferred embodiment of the magnetic recording and reproducing apparatus according to the present invention.

FIG. 5 is a block diagram of a preferred embodiment of the magnetic recording and reproducing apparatus according to the present invention. Referring to FIG. 5, a recording signal is applied to an input terminal 11, and a test signal is generated from a test signal source 21. A signal selection switch $S_3$ selects the recording signal or the test signal. A tape selection switch $S_1$ is provided to supply necessary information to a tape material input circuit 33 depending on the type of a magnetic tape 23 used for recording. A memory selection switch $S_4$ is connectable to a memory 30 storing previously a plurality of sets of preset control values or signals for a plurality of magnetic tapes so that the control values for the specific magnetic tape 23 used for recording can be selected prior to the recording of the recording signal on that magnetic tape. A start switch $S_2$ places the magnetic recording and reproducing apparatus in operation when actuated. The test signal source 21 is capable of generating one of a plurality of test signals at different frequencies in response to a control signal applied from a control unit 31. Herein, the test signal source 21 generates four test signals at 1 kHz, 5 kHz, 7 kHz and 14 kHz respectively.

The test signal from the test signal source 21 is applied through the signal selection switch $S_3$ to a variable-gain amplifier 18 whose gain is variable stepwise in response to a gain control signal applied from the control unit 31. The amplified test signal is applied from the variable-gain amplifier 18 to a middle frequency range equalizer 19 in which the rolloff frequency is variable stepwise in response to a middle frequency response control signal applied from the control unit 31. The test signal is then applied from the middle frequency range equalizer 19 to a high frequency range equalizer 20 in which the peaking is variable stepwise in response to a high frequency response control signal applied from the control unit 31. Finally, the test signal is applied from the high frequency range equalizer 20 to a recording transducer or recording head 16 to be recorded on the magnetic tape 23. It is apparent that the amplifier 18 and the equalizers 19, 20 are provided to handle normally the recording signal applied through the signal selection switch $S_3$. A bias control signal is applied from the control unit 31 to a bias generating circuit 13 through a D/A converter 22 to vary the recording bias current supplied from the bias generating circuit 13. During recording, the recording bias current is supplied to the recording head 16.

A reproducing transducer or reproducing head 24 reproduces the test signal recorded on the magnetic tape 23. The reproduced test signal is applied to an A/D converter 28 through an amplifier 26 and a rectifier circuit 27. The A/D converter 28 provides a digital output signal corresponding to the output signal from the reproducing head 24, and this digital signal is applied to an operating circuit unit 29. The control unit 31, the memory 30 and the operating circuit unit 29 are enabled in response to a control signal applied from a driver 32 which is enabled in response to the actuation of the start switch $S_2$. A reference value is also previously stored in the memory 30 so that the reference value is utilized during an adjusting operation cycle. The digital output signal from the A/D converter 28 is compared with this reference value in the operating circuit unit 29, and an error signal indicative of the difference therebetween appears from the operating circuit unit 29. This error signal is stored once in the memory 30 and is then applied to the control unit 31 to renew the gain control signal and the frequency response control signals as required. The functions of the control unit 31, memory 30, operating circuit unit 29, driver 32 and tape material input circuit 33 enclosed in the dotted block 90 can be achieved by a microcomputer or microprocessor. The symbol ST designates a start signal, and the numeral 25 designates a reproduced signal output terminal.

Figure 6:
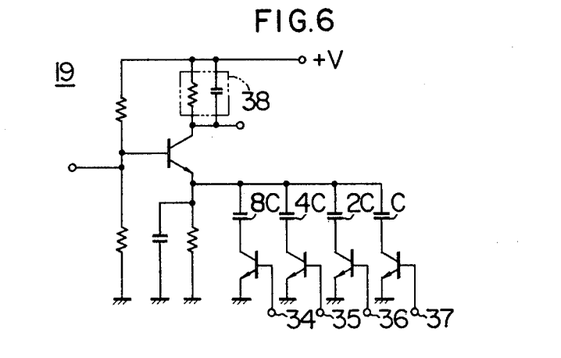
FIG. 6 is a circuit diagram showing the practical structure of one form of the middle frequency range equalizer which may be used in the apparatus shown in FIG. 5.
Figure 7:
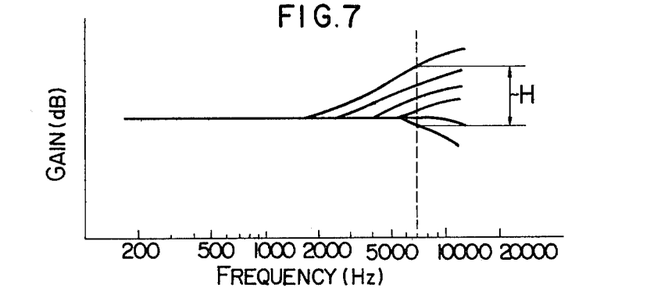
FIG. 7 shows the frequency response of the circuit shown in FIG. 6.

FIG. 6 is a circuit diagram showing the practical structure of one form of the middle frequency range equalizer 19. Referring to FIG. 6, one or more of capacitors having capacitance values 8C, 4C, 2C and C respectively are selected by the middle frequency response control signal applied in the form of parallel four-bit signal to control terminals 34, 35, 36 and 37. Since the combination of the four bits provides sixteen numerical values, the rolloff frequency of the middle frequency range equalizer 19 can be finely controlled over the sixteen stages. FIG. 7 shows the frequency response of the circuit shown in FIG. 6. The rolloff frequency is lowest when all of the capacitances are made effective, and with the decrease in the composite capacitance value, the rolloff frequency becomes higher and is attenuated by the action of a high frequency attenuator 38. The symbol H in FIG. 7 designates the varying range of the rolloff frequency.

Figure 8:
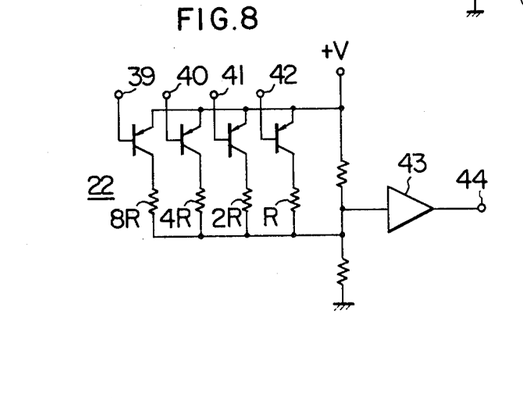
FIG. 8 is a circuit diagram showing the practical structure of one form of the D/A converter which may be used in the apparatus shown in FIG. 5.

FIG. 8 is a circuit diagram showing the practical structure of one form of the D/A converter 22. Referring to FIG. 8, one or more of resistors having resistance values 8R, 4R, 2R and R respectively are selected by the bias control signal applied in the form of parallel four-bit signal to control terminals 39, 40, 41 and 42, so that the voltage applied to the input terminal of an amplifier 43 is variable over sixteen stages. This input voltage is amplified by the amplifier 43 to appear at its output terminal 44 which is connected to the power supply terminal of the bias generating circuit 13. Therefore, the power supply voltage applied to the bias generating circuit 13 is variable over the sixteen stages, and a variation in the power supply voltage from one stage to another results in a corresponding variation in the bias current supplied from the bias generating circuit 13. The memory 30 includes at least a plurality of random access memories (RAM's) each of which stores the control values associated with the corresponding magnetic tape having been subjected to the automatic adjustment of recording conditions and which are selectively enabled by the selection switch $S_4$.

Returning back to FIG. 5 the operation of the magnetic recording and reproducing apparatus according to the present invention will now be described. At first, the selection switch $S_1$ is actuated to supply the information of the type of a magnetic tape 23 used for recording to the tape material input circuit 33. The start switch $S_2$ is then depressed to generate the start signal ST and to energize the driver 32. Consequently, the control unit 31, memory 30 and operating circuit unit 29 are enabled. The start signal ST is also used to enable the head and tape drive mechanisms (not shown) of the magnetic recording and reproducing apparatus. The initial step is the automatic adjustment of the recording bias. To this end, the test signal source 21 generates a test signal at a frequency of 5 kHz in response to a control signal applied from the control unit 31. As described hereinbefore, preset control values or signals are stored previously in the memory 30. The preset control signals stored in the memory 30 are applied from the control unit 31 to the variable-gain amplifier 18, to the middle frequency range equalizer 19 and to the high frequency range equalizer 20 respectively, at the time at which the 5-kHz test signal is generated from the test signal source 21. The preset control values may be the data of a standard magnetic tape, or the data of a specific magnetic tape stored in the memory 30. It may also be the central value of a variable range as, for example, that provided by the combination of four bits. In this case, the preset control value is "1000" which is the central value of the sixteen stages ranging from "0000" to "1111".

Then, the bias control signal varying stepwise from "0000" to "1111" is applied from the control unit 31 to the D/A converter 22, and while varying stepwise the recording bias current supplied from the bias generating circuit 13, the 5-kHz test signal is recorded on the magnetic tape 23 by the recording head 16 and is then reproduced from the magnetic tape 23 by the reproducing head 24. The test signal reproduced from the magnetic tape 23 is applied from the reproducing head 24 to the operating circuit unit 29 through the amplifier 26, the rectifier circuit 27 and the A/D converter 28.

The level of this reproduced test signal becomes maximum at one of the recording bias current values, and this maximum output level is detected by the operating circuit unit 29. It has been experimentally confirmed that the optimum bias current value is about 10 to 20% larger than the value providing the maximum output level when the frequency of the recorded test signal is 5 kHz. The operating circuit unit 29 makes necessary the calculation to find the optimum bias current value. This optimum bias current value is stored in the memory 30, and at the same time, the control unit 31 applies the corresponding bias control signal to the D/A converter 22 to set the bias current supplied from the bias generating circuit 13 at this optimum value. It has also been experimentally confirmed that the bias current value providing the maximum reproduced output level is the optimum bias current value when the frequency of the test signal is 1 kHz. For details, reference is to be made to, for example, H. M. Tremaine: The AUDIO CYCLOPEDIA 1st edition, Section 17 "Magnetic Recording", pp. 511–513, Howard W. Sams & Co., Inc. and The Bobbs-Merrill Co., Inc., New York, 1959. The optimum bias current value is set in the manner above described. For the purpose, the test signal frequency in the present embodiment may be approximately from about 1 kHz to about 7 kHz. This optimum bias current value is kept invariable throughout the succeeding steps of automatic adjustment of the recording frequency response compensation.

The step of automatic adjustment of the recording bias is followed by the step of automatic adjustment of the recording frequency response compensation. At first, the gain control signal applied from the control unit 31 for controlling the gain of the variable-gain amplifier 18 is adjusted to suit the sensitivity of the magnetic tape 23 used for recording. The test signal source 21 generates a test signal at a frequency of 1 kHz in response to a control signal applied from the control unit 31. This 1-kHz test signal passes through the variable-gain amplifer 18, middle frequency range equalizer 19 and high frequency range equalizer 20 to be recorded on the magnetic tape 23 by the recording head 16. The recorded test signal is reproduced from the magnetic tape 23 by the reproducing head 24, and after being amplified by the amplifier 26 and rectified by the rectifier circuit 27, it is converted into the corresponding digital signal by the A/D converter 28. At this time, the preset gain control signal previously stored in the memory 30 is applied through the control unit 31 to the variable-gain amplifier 18. The digital signal obtained by the A/D conversion in the A/D converter 28 is applied to the operating circuit unit 29 in the microcomputer 90 to be compared with the reference value previously stored in the memory 30. The operating circuit unit 29 calculates the required degree of modification of the gain of the variable-gain amplifier 18 so as to compensate for the sensitivity of the magnetic tape 23 and to obtain the desired reproduced output level. As the result of this calculation, the necessary control data is stored in the memory 30 to renew the preset gain control value, and at the same time, the gain control signal indicative of the renewed preset control value is applied from the control unit 31 to the variable-gain amplifier 18. The above operation completes the compensation for the sensitivity of the magnetic tape 23.

Subsequently, for the purpose of determination of the recording frequency response compensation in the middle frequency range, the test signal source 21 generates a test signal at a frequency of 7 kHz in response to a control signal applied from the control unit 31, and this test signal is recorded and reproduced in a manner similar to that described hereinbefore. At this time, the preset middle frequency response control signal previously stored is applied from the control unit 31 to the middle frequency range equalizer 19. The reproduced test signal is A/D converted in the A/D converter 28, and the digital signal thus obtained is compared in the operating circuit unit 29 with the reference value previously stored in the memory 30. When the result of calculation proves that the high frequency response control signal should be raised for example, by two levels or stages for the full compensation, the data "1010" (="1000"+"0010") is now stored in the memory 30 to renew the preset control value, and at the same time, the middle frequency response control signal indicative of the renewed preset control value "1010", that is, "1", "0", "1" and "0" are applied respectively to the control terminals 34, 35, 36 and 37 of the middle frequency range equalizer 19 shown in FIG. 6. The above step completes the automatic adjustment of the recording frequency response compensation in the middle frequency range. In the following step of automatic adjustment of the recording frequency response compensation in the high frequency range, a test signal at a frequency of 14 kHz is similarly recorded and reproduced for the compensation purpose so that the proper high frequency response control signal can be applied to the high frequency range equalizer 20 from the control unit 31.

The recording bias current can be adjusted to the optimum value, and the frequency response during recording and reproduction can be flattened by the steps described hereinbefore.

It will be noted from the above description that the recording bias current is initially adjusted, and then, the recording frequency response compensation is adjusted, according to the present invention. This is because the recording bias exerts influence on the frequency response. Further, it is preferable that the frequencies of the test signals used in the adjusting operation become higher as the adjustment of the frequency response control signals proceeds.

The reference value used in the above manner of bias control, gain control and frequency response control is supplied and stored in the memory 30 as soon as the magnetic recording and reproducing apparatus is placed in operation, i.e. previously to the initiation of the adjusting operation.

It will be understood from the above description of a preferred embodiment of the present invention that the optimum bias current and the proper recording frequency response compensation complying with the characteristics of a magnetic tape used for recording can be always automatically obtained thereby ensuring recording with a low distortion, a wide dynamic range and a flat frequency response.

The data concerning the optimum recording bias current, the proper gain control signal and the proper frequency response control signals thus obtained on the specific magnetic tape 23 in the manner above described are grouped into one set to be stored in one of the RAM's in the memory 30. In this manner, those for a plurality of different types of magnetic tapes are stored in the associated RAM's in the memory 30 to be selectively read out from the memory 30 when the memory selection switch $S_4$ is actuated to specify the magnetic tape used for recording.

A magnetic tape includes a leader tape portion having no magnetic coating thereon and is furnished in its completely rewound state. Thus, when this magnetic tape is mounted in the magnetic recording and reproducing apparatus possessing the functions above described, the test signal is not recorded on and reproduced from that portion of the magnetic tape, and the above functions will not be exhibited due to, for example, underflow of the A/D converter 28. Further, immediately after the magnetic tape starts to be supplied from the supply reel, travelling movement of the magnetic tape may be unstable until it travels steadily at the rated speed, and the reproduced output level tends to fluctuate considerably, resulting in such a possibility that the optimum recording bias current, the proper gain control signal and the proper frequency response signals may not be obtained with the desired accuracy.

A partial modification of the magnetic recording and reproducing apparatus according to the present invention is constructed such that the automatic adjustment of the recording bias, amplifier gain and recording frequency response compensation may not be initiated until the magnetic tape continues to travel for a predetermined length of time after the actuation of the start switch $S_2$.

Figure 9:
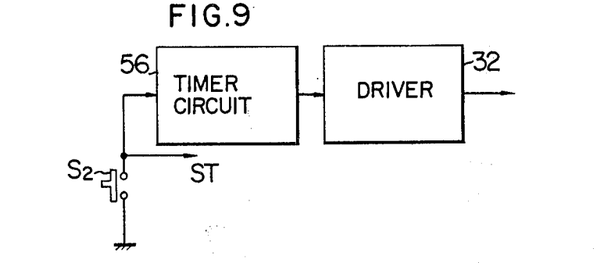
FIG. 9 is a block diagram of a partial modification of the magnetic recording and reproducing apparatus according to the present invention.

Referring to FIG. 9, this partial modification comprises a delay means such as a timer circuit 56 connected between the start switch $S_2$ and the driver 32. This timer circuit 56 is additionally provided so as to prevent malfunction of the apparatus due to the presence of the leader tape portion and also due to the unstable travelling movement of the magnetic tape in the initial stage of its movement as pointed out hereinbefore. Thus, after the start signal ST has been generated by the actuation of the start switch $S_2$ to place the tape drive system and the head drive system in the recording mode, the start signal ST is delayed by the timer circuit 56 for a period of time corresponding to the length of the leader tapes portion of the magnetic tape 23, and after that period of time, the start signal ST is applied to the driver 32 so as to initiate the automatic adjustment of the recording bias, amplifier gain and frequency response compensation.

Figure 10:
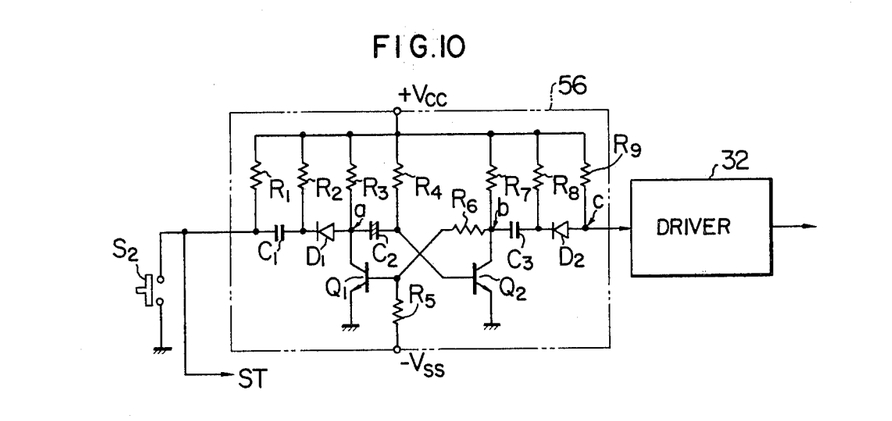
FIG. 10 is a circuit diagram showing the practical structure of one form of the timer circuit which may be used in the partial modification shown in FIG. 9.
Figure 11:
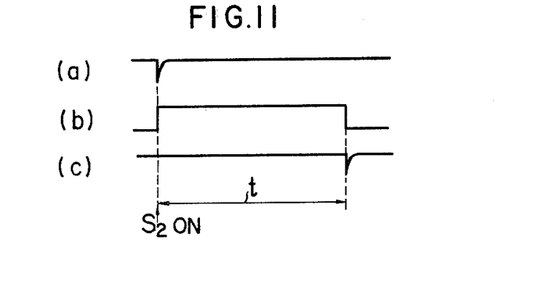
FIG. 11 shows the waveforms of signals appearing at various points in the circuit shown in FIG. 10.

The practical structure of one form of the timer circuit 56 is shown in the portion enclosed by the broken lines in FIG. 10. Referring to FIG. 10, the timer circuit 56 comprises transistors $Q_1$, $Q_2$, resistors $R_1$ to $R_9$, capacitors $C_1$ to $C_3$ and diodes $D_1$, $D_2$. The transistors $Q_1$ and $Q_2$ constitute a monostable multivibrator together with the resistors $R_3$ to $R_7$ and the capacitor $C_2$. In response to the application of $+V_{cc}$ and $-V_{ss}$ to the timer circuit 56, the transistors $Q_1$ and $Q_2$ are turned off and on respectively. When the start switch $S_2$ is closed, the start signal ST resulting from the voltage drop from $+V_{cc}$ toward 0 volt appears at the connection point of the start switch $S_2$ and the resistor $R_1$. This start signal ST is then differentiated by the differentiator composed of the capacitor $C_1$ and the resistor $R_2$, and the falling waveform portion only of the differentiated waveform passes through the diode $D_1$ to be applied to the collector of the transistor $Q_1$ as a trigger signal for the monostable multivibrator constituted by the transistors $Q_1$ and $Q_2$. This trigger signal acts through the capacitor $C_2$ to turn off the transistor $Q_2$ which has been turned on. Subsequently, the transistors $Q_1$ and $Q_2$ are turned off and on again after a predetermined period of time t determined by the resistance value of the resistor $R_4$ and the capacitance value of the capacitor $C_2$, in the manner well known in the art. The output signal from the transistor $Q_2$ is differentiated by the differentiator composed of the capacitor $C_3$ and the resistor $R_8$, and the falling waveform portion only of the differentiated waveform is extracted by the combination of the diode $D_2$ and the resistor $R_9$, so that the start signal ST can be equivalently delayed. FIG. 11 shows the signal waveforms appearing at the points a, b and c in FIG. 10. The delay time t is selected to be equal to the length of time required for the complete travelling movement of the leader tape portion past the recording head 16. For example, this delay time t is set at about 5 seconds. Thus, the start signal ST instructing the starting of the actual automatic adjustment of the recording bias, amplifier gain and frequency response compensation is applied to the driver 32 after the leader tape portion of the magnetic tape 23 making its travelling movement in response to the actuation of the start switch $S_2$ has completely travelled past the recording head 16, and after the travelling movement of the magnetic tape 23 has been sufficiently stabilized.

Figure 12:
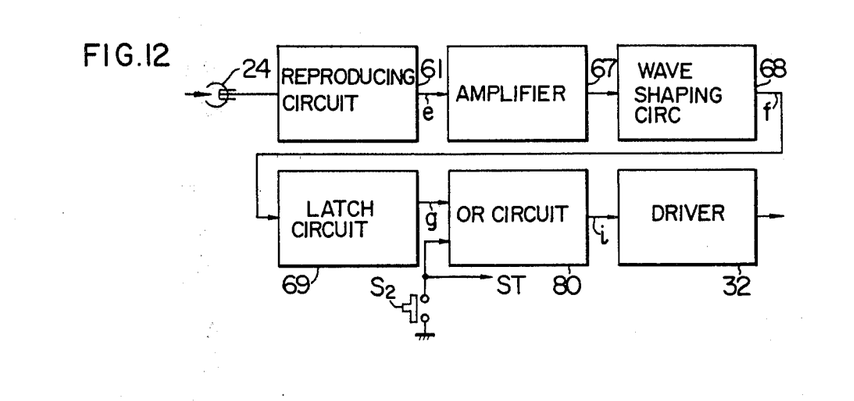
FIG. 12 is a block diagram of part of another embodiment or a modification of the magnetic recording and reproducing apparatus according to the present invention.

When the tape drive system is continuously stable throughout its operation including the initial stage of the travelling movement of the magnetic tape 23, it may be only necessary to detect the leader tape portion of the magnetic tape 23. FIG. 12 is a block diagram of another embodiment or a modification of part of the aforementioned embodiment, and the modification is constructed to automatically detect the leader tape portion of the magnetic tape 23. Referring to FIG. 12, the start signal ST generated in response to the actuation of the start switch $S_2$ is applied through an OR circuit 80 to the driver 32 to place the magnetic recording and reproducing apparatus in operation, as described with reference to FIG. 5. That is, the step of recording and reproducing the test signal on and from the magnetic tape 23 is started. In the embodiment or modification shown in FIG. 12, the reproducing head 24 is connected to a reproducing circuit 61 which is connected to an amplifier 67 so that the output signal from this amplifier 67 can be utilized to detect the appearance of the reproduced output. The test signal is not recorded on nor reproduced from the leader tape portion having no magnetic coating thereon. After the leader tape portion is taken up on the tape-up reel and the tape portion having the magnetic coating thereon starts to travel past the recording head 16 and then the reproducing head 24, the test signal recorded on and reproduced from the magnetic tape 23 is amplified by the amplifier 67 and is then shaped into a rectangular waveform by a wave shaping circuit 68 which includes a transistor switch or a Schmidt trigger circuit. The wave-shaped test signal is then applied to a latch circuit 69 to set the same, that is, the latch circuit 69 stores data indicative of the fact that the reproduced test signal has appeared. Although not shown in detail in FIG. 12, a restart signal appears from the latch circuit 69 at that instant to be applied through the OR circuit 80 to the driver 32. This is equivalent to the application of the start signal ST to the driver 32 again. It is apparent that this restart signal does not appear when no leader tape portion exists at the time of initial generation of the start signal ST.

Figure 13:
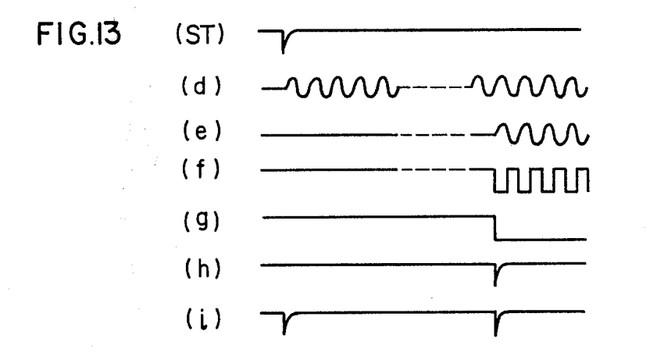
FIG. 13 shows the waveforms of signals appearing from the various blocks shown in FIG. 12.

FIG. 13 shows the signal waveforms appearing at signal paths e, f, g, h and i in FIG. 12 together with the other relevant signal waveforms. The waveform of the start signal ST generated in response to the actuation of the start switch $S_2$ is shown in (ST) of FIG. 13, and this waveform corresponds to that shown in (a) of FIGS. 10 and 11. The waveform of the test signal generated in response to the appearance of the start signal ST is shown in (d) of FIG. 13. FIG. 13 shows in (e) the waveform of the reproduced test signal. It will be seen in (e) of FIG. 13 that no test signal is reproduced from the leader tape portion of the magnetic tape 23, and the test signal is reproduced from the succeeding portion of the magnetic tape 23 after being recorded by the recording head 16. FIG. 13 shows in (f) the waveform of the reproduced test signal which is amplified by the amplifier 67 and is then shaped into the rectangular waveform by the wave shaping circuit 68 shown in FIG. 12. The latch circuit 69 is set at the instant at which the waveform shown in (f) of FIG. 13 falls to its low level, and the output of the latch circuit 69 is inverted at that instant. The waveform of the output signal from the latch circuit 69 is shown in (g) of FIG. 13. As is well known to those skilled in the art, this latch circuit 69 is also called an RS flip-flop. This RS flip-flop is composed of a pair of two-input NAND gates, and the output of each individual NAND gate is connected to one of the inputs of the other. The output signal of the RS flip-flop inverted from its high level to its low level is utilized to produce the leader end signal, that is, the restart signal. FIG. 13 shows in (h) the waveform obtained by differentiating the waveform shown in (g). It is apparent that this waveform corresponds to that shown in (c) of FIGS. 10 and 11. The waveform shown in (i) of FIG. 13 represents the OR logic of the waveforms shown in (ST) and (h). That is, this is the waveform of the output signal from the OR circuit 80, and the illustrated waveform is applied to the driver 32 as the start signal ST.

Thus, according to the embodiments or modifications shown in FIGS. 9 and 12, the magnetic tape 23 is driven for a predetermined period of time until its leader tape portion travels completely past the recording head 16, so that malfunction of the apparatus due to the presence of the leader tape portion can be prevented, and the reproduced output signal can also be stabilized. Therefore, the automatic adjustment of the recording bias, amplifier gain and frequency response compensation can be achieved with high accuracy. Further, due to the fact that non-existence of the leader tape portion can be automatically detected, the automatic adjustment of the recording bias, amplifier gain and frequency response compensation can also be smoothly carried out.

No control signals will appear from the control unit 31 when no control values for a magnetic tape are stored in the memory 30. In such a case, it may be impossible to record a desired signal on the magnetic tape. It may be very inconvenient for the user to wait until the automatic adjustment of the magnetic recording and reproducing apparatus is completed especially when the user desires to hastily record the signal on the magnetic tape.

Figure 14:
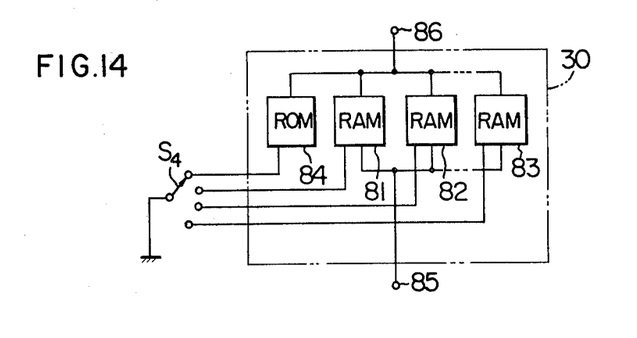
FIG. 14 is a circuit diagram showing the practical structure of one form of the memory which may be used in the apparatus shown in FIG. 5.

FIG. 14 shows a modification of the internal structure of the memory 30 shown in FIG. 5 so that the above requirement can be met. Referring to FIG. 14, the memory 30 includes a plurality of random access memories (RAM's) 81, 82, 83 and a read-only memory (ROM) 84. A write terminal 85 is connected to the operating circuit unit 29 shown in FIG. 5, and a read terminal 86 is connected to the control unit 31 shown in FIG. 5. The symbol $S_4$ designates similarly the memory selection switch.

In FIG. 14, the control values associated with each individual magnetic tape obtained as the result of the automatic adjustment in the manner described hereinbefore are stored in the corresponding one of the RAM's 81 to 83, while the control values for a standard magnetic tape are stored in the form of an IC pattern in the ROM 84 during the manufacture of apparatus, which is a non-volatile memory.

Therefore, when there is no time for the automatic adjustment and yet the user wants to hastily record a desired signal on a magnetic tape or even when no data are stored in any of the RAM's 81 to 83, the data stored in the ROM 84 can be used for the desired recording. Although, in such a case, the full performance will not be exhibited since the characteristics of the magnetic tape used for recording differ generally from those of the standard or usual magnetic tape, the purpose of hasty recording will be sufficiently fulfilled.

The employment of the memory 30 shown in FIG. 14 provides such an advantage that a desired signal can be recorded without waiting for the result of automatic adjustment thereby enhancing the utility of the audio set.

Figure 15:
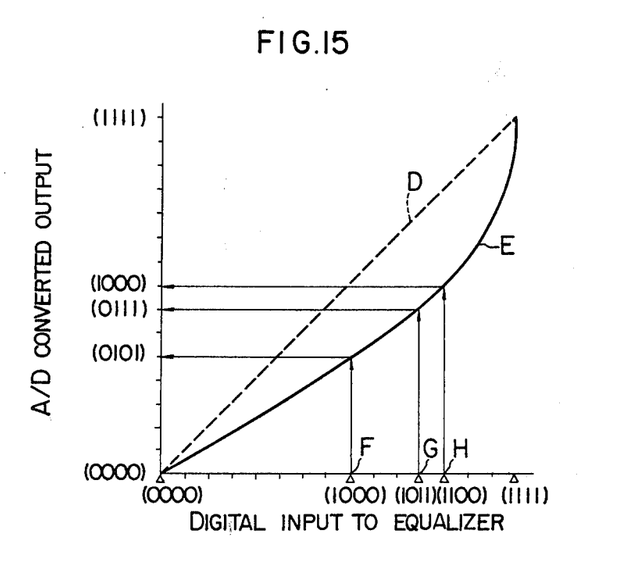
FIGS. 15 and 17 illustrate how the frequency response is adjusted in the magnetic recording and reproducing apparatus according to the present invention.

In the automatic adjustment of the gain of the variable-gain amplifier 18 and also in the automatic adjustment of the frequency response of each of the variable equalizers 19 and 20 in the magnetic recording and reproducing apparatus shown in FIG. 5, the digital output signal from the A/D converter 28 is compared in the operating circuit unit 29 with the reference value as described hereinbefore. In this case, the input-output characteristic of the A/D converter 28 must coincide with the input-output characteristic of the controlled variable-gain amplifier 18 or with that of the controlled variable equalizer 19 or 20. The relation therebetween is illustrated in FIG. 15 taking one of the variable equalizers as an example. In FIG. 15, the abscissa represents the digital input to the variable equalizer, and the ordinate represents the A/D converted digital output from the A/D converter 28. The relation between the control input to the variable equalizer and the digital output from the A/D converter 28 should normally be linear as shown by the broken curve D in FIG. 15. However, the above relation is almost invariably not linear as shown by the solid curve E since the variable equalizer is generally composed of components L, C, R, etc. The control input to the variable equalizer and the digital output from the A/D converter 28 are both of four bits. Thus, when the control input to the variable equalizer is "1000" as shown at a point F, the corresponding digital output from the A/D converter 28 is "0101". In the system under consideration, the reference value, that is, the reference A/D converted value is "1000" as described hereinbefore. This means that the digital output from the A/D converter 28 is less than "1000" by "1000"−"0101"="0011". Therefore, the control input given by "1000"+"0011"="1011" shown at a point G is applied to the variable equalizer. The digital output from the A/D converter 28 at that time is "0111" and is not "1000" as seen in FIG. 15, and an error is given rise to. As pointed out above, this error is attributable to the fact that the relation between the control input to the variable equalizer and the digital output from the A/D converter 28 is not linear. When the frequency response flattening control is carried out in such a situation, the frequency response of the variable equalizer will deviate from the proper one. Further, an attempt to establish the linear relation between the input and the output will sometimes result in a very complex circuit structure.

The inventors have found that the variable-gain amplifier and variable equalizers can be controlled to be substantially error-free by repeating twice or more the cycle of test signal recording→reproduction→A/D conversion→gain or frequency response control.

To this end, the gain control signal or the frequency response control signal of a certain value is preset for the variable-gain amplifier or to the variable equalizers, and the value of the output from the A/D converter 28 A/D converting the reproduced level of the recorded test signal is compared with the reference value for such a control signal to find the error of the former from the latter, so as to control the variable-gain amplifier or the variable equalizers depending on the error. The above error results when the relation between the control input to the variable-gain amplifier or to the variable equalizers and the digital output from the A/D converter 28 is not linear as described with reference to FIG. 15. The manner of control will now be described with reference to FIG. 15. In FIG. 5, the digital input to the variable equalizer at the point G is "1011", and the corresponding digital output from the A/D converter 28 is "0111". In that state, the test signal is recorded and reproduced again to obtain the output level "0111", and this value "0111" is compared again with the reference value "1000" to obtain the error "1000"−"0111"="0001". Then, the sum of the preceding input and the error, that is, "1011"+"0001"="1100" corresponding to the value at a point H in FIG. 15 is applied as the digital input to the variable equalizer. Thus, when the relation between the control input to the variable-gain amplifier or to the variable equalizers and the digital output from the A/D converter makes a monotonous increase or decrease, the desired accurate alignment in the control level can be successfully achieved regardless of whatever variation in the relation by increasing the number N of the control cycles.

Figure 16:
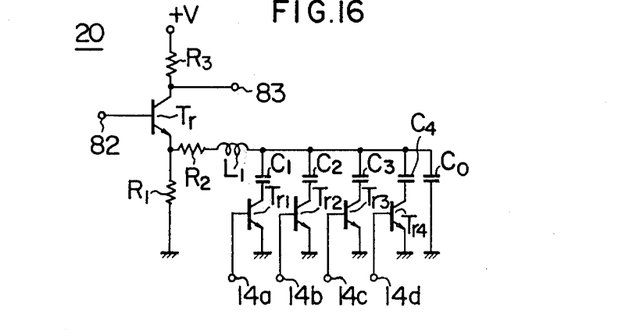
FIG. 16 is a circuit diagram showing the practical structure of one form of the high frequency range equalizer which may be used in the apparatus shown in FIG. 5.
Figure 17:
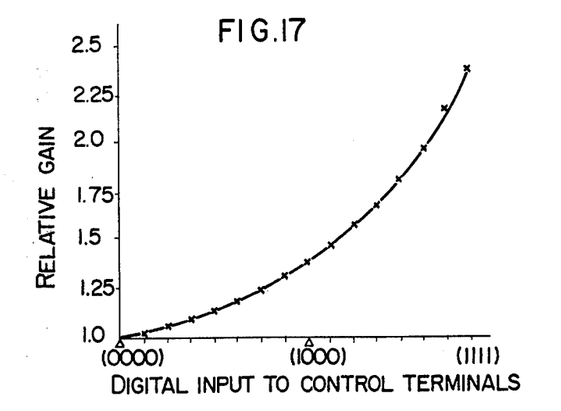

FIG. 16 shows the practical structure of one form of the high frequency range equalizer 20. Referring to FIG. 16, this equalizer includes an input terminal 82, an output terminal 83, a plurality of capacitors $C_1$, $C_2$, $C_3$ and $C_4$ having weights of 1, 2, 4 and 8 respectively, and a plurality of control signal input terminals 14a, 14b, 14c and 14d each of which receives a "0" or a "1". FIG. 17 shows the gain of the high frequency range equalizer 20 relative to the digital input of four bits applied to the control terminals 14a to 14d when the frequency of the test signal is 14 kHz.

Figure 18:
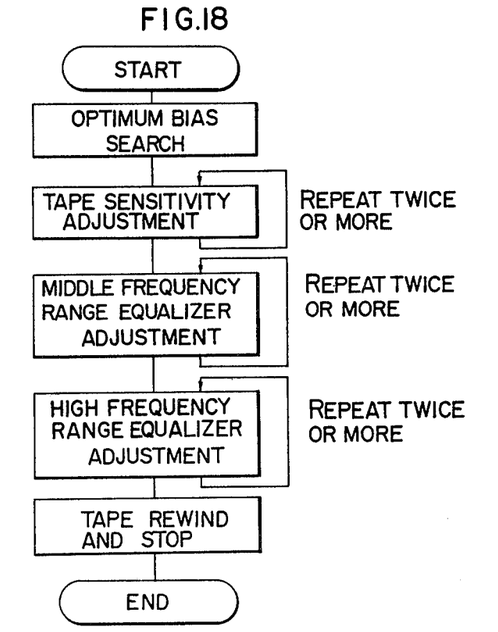
FIG. 18 is a flow chart showing the steps of adjustment of the recording conditions for a magnetic tape mounted in the magnetic recording and reproducing apparatus according to the present invention.

FIG. 18 is a flow chart showing the steps of adjustment of the recording conditions for a magnetic tape mounted in the magnetic recording and reproducing apparatus according to the present invention.

It will be understood from the description given with reference to FIGS. 15 to 18 that the desired accurate level alignment can be reliably achieved even when the relation between the control input to the variable-gain amplifier or to the variable equalizers and the digital output from the A/D converter is out of flatness, or, for example, even when the variable equalizers are of simple construction composed of components L, C and R. Therefore, the magnetic recording and reproducing apparatus according to the present invention can record and reproduce a signal on and from a magnetic tape of any type with high fidelity and with desired flatness in the frequency response during recording and reproduction.

We claim:

1. A magnetic recording and reproducing apparatus automatically adjustable to each individual magnetic tape, comprising:
   a source for producing a plurality of test signals at different frequencies;
   a variable gain amplifier controlled by a gain control signal for amplifying said test signals, said amplifier normally serving to amplify a recording signal;
   equalizer means controlled by a frequency response control signal for equalizing said test signals, said equalizer means normally serving to equalize said recording signal;
   a recording bias generating circuit controlled by a bias control signal for generating a recording bias;
   a recording transducer for recording said test signals on the magnetic tape, said recording transducer normally serving to record said recording signal;
   a reproducing transducer for reproducing said test signals recorded on the magnetic tape, said reproducing transducer normally serving to reproduce said recording signal;
   a memory for storing at least a reference value;
   operating means for calculating said gain control signal, said frequency response control signal and said bias control signal by using said reference value and outputs of said reproducing transducer for said test signals reproduced from the magnetic tape; and
   control means for supplying said gain control signal, said frequency response control signal and said bias control signal to said variable gain amplifier, said equalizer means and said recording bias generating circuit, respectively.

2. A magnetic recording and reproducing apparatus according to claim 1,
   wherein said equalizer means is constructed by a first equalizer for compensating the frequency characteristic of the magnetic tape in the intermediate frequency range and a second equalizer for compensating the frequency characteristic of the magnetic tape in the high frequency range.

3. A magnetic recording and reproducing apparatus according to claim 2, in which said memory includes a plurality of RAMs and a memory select switch is provided for enabling a desired one of said RAMs according to a magnetic tape in use.

4. A magnetic recording and reproducing apparatus according to claim 3, in which said memory further includes a ROM in which predetermined values for said bias control signal, said gain control signal and said frequency response control signal are stored so that the magnetic recording and reproducing apparatus can be set for a recording operation without adjustment for instantly initiating a recording.

5. A magnetic recording and reproducing apparatus according to claim 2, further comprising means for delaying the initiation of the adjustment by a predetermined time period corresponding to the length of the leading portion of said magnetic tape.

6. A magnetic recording and reproducing apparatus according to claim 2, further comprising means connected with said reproducing transducer for detecting the recording of one of said test signals and means for initiating the adjusting operation responsive to the output of said detecting means.

7. A magnetic recording and reproducing apparatus according to claim 1,
   wherein said memory includes means for storing preset values for said gain control signal and said frequency response control signal and said operating means includes means for comparing said reference value with each of said outputs of said reproducing transducer for said test signals at said preset values supplied to said variable gain amplifier and said equalizer means in order to calculate said gain control signal and said frequency response control signal.

8. A magnetic recording and reproducing apparatus according to claim 7, in which said memory includes a plurality of RAMs and a memory select switch is provided for enabling a desired one of said RAMs according to a magnetic tape in use.

9. A magnetic recording and reproducing apparatus according to claim 8, in which said memory further includes a ROM in which predetermined values for said bias control signal, said gain control signal and said frequency response control signal are stored so that the magnetic recording and reproducing apparatus can be set for a recording operation without adjustment for instantly initiating a recording.

10. A magnetic recording and reproducing apparatus according to claim 7, further comprising means for delaying the initiation of the adjustment by a predetermined time period corresponding to the length of the leading portion of said magnetic tape.

11. A magnetic recording and reproducing apparatus according to claim 7, further comprising means connected with said reproducing transducer for detecting the recording of one of said test signals and means for initiating the adjusting operation responsive to the output of said detecting means.

12. A magnetic recording and reproducing apparatus according to claim 1,
   wherein said operating means includes means for using outputs of said reproducing transducer for one of said test signals at all stages of said bias control signal successively supplied to said recording bias generating circuit in order to calculate an optimum value of said bias control signal.

13. A magnetic recording and reproducing apparatus according to claim 12, in which said memory includes a plurality of RAMs and a memory select switch is provided for enabling a desired one of said RAMs according to a magnetic tape in use.

14. A magnetic recording and reproducing apparatus according to claim 13, in which said memory further includes a ROM in which predetermined values for said bias control signal, said gain control signal and said frequency response control signal are stored so that the magnetic recording and reproducing apparatus can be set for a recording operation without adjustment for instantly initiating a recording.

15. A magnetic recording and reproducing apparatus according to claim 12, further comprising means for delaying the initiation of the adjustment by a predetermined time period corresponding to the length of the leading portion of said magnetic tape.

16. A magnetic recording and reproducing apparatus according to claim 12, further comprising means connected with said reproducing transducer for detecting the recording of one of said test signals and means for initiating the adjusting operation responsive to the output of said detecting means.

17. A magnetic recording and reproducing apparatus according to claim 1, in which said memory includes a plurality of RAMs and a memory select switch is provided for enabling a desired one of said RAMs according to a magnetic tape in use.

18. A magnetic recording and reproducing apparatus according to claim 17, in which said memory further includes a ROM in which predetermined values for said bias control signal, said gain control signal and said frequency response control signal are stored so that the magnetic recording and reproducing apparatus can be set for a recording operation without adjustment for instantly initiating a recording.

19. A magnetic recording and reproducing apparatus according to claim 1, further comprising means for delaying the initiation of the adjustment by a predetermined time period corresponding to the length of the leading portion of said magnetic tape.

20. A magnetic recording and reproducing apparatus according to claim 1, further comprising means connected with said reproducing transducer for detecting the recording of one of said test signals and means for initiating the adjusting operation responsive to the output of said detecting means.

21. A magnetic recording and reproducing apparatus according to claim 1, wherein said control means comprises a microcomputer.

22. A magnetic recording and reproducing apparatus according to claim 1, wherein said memory, said operating means and said control means comprises a microcomputer.

23. A method of adjusting recording conditions of a magnetic recording and reproducing apparatus to each individual magnetic tape, the apparatus including means for recording a signal through a signal recording path on a magnetic tape and means for reproducing the signal recorded on said magnetic tape, comprising the steps of:
 (a) applying preset values of a gain control signal, a middle frequency response control signal and a high frequency response control signal to a variable gain amplifier for compensating the sound recording sensitivity of the magnetic tape, a first equalizer for compensating the frequency characteristic of the magnetic tape in the intermediate frequency range and a second equalizer for compensating the frequency characteristic of the magnetic tape in the high frequency range respectively, all of which are inserted in the signal recording path;
 (b) supplying a first test signal having a low frequency to the signal recording path;
 (c) recording said first test signal on the magnetic tape by the recording means;
 (d) reproducing said first test signal recorded on the magnetic tape by the reproducing means;
 (e) comparing said first test signal reproduced from the magnetic tape with a reference value;
 (f) renewing said gain control signal in response to the difference between said first test signal and said reference value;
 (g) repeating the steps of (b)-(f) at least twice;
 (h) executing the steps (b)-(g) for said middle frequency response control signal by using a second test signal instead of said first test signal; and
 (i) executing the steps (b)-(g) for said high frequency response control signal by using a third test signal instead of said first test signal.

24. A method of adjusting recording conditions of a magnetic recording and reproducing apparatus according to claim 23, further comprising:
 (j) supplying a fourth test signal to the signal recording path;
 (k) applying a bias control signal varying successively stepwise in plural stages to a recording bias control signal;
 (l) recording said fourth test signal on the magnetic tape by the recording means;
 (m) reproducing said fourth test signal recorded on the magnetic tape by the reproducing means; and
 (n) calculating an optimum value of said bias control signal from outputs of said reproducing transducer for said fourth test signal at all stages of said bias control signal;
 said steps (j)-(n) being carried out between said step (a) and said step (b).

25. A method of adjusting recording conditions of a magnetic recording and reproducing apparatus according to claim 24,
 wherein said first test signal, said second test signal and said third test signal have a low frequency, an intermediate frequency and a high frequency, respectively.

26. A method of adjusting recording conditions of a magnetic recording and reproducing apparatus according to claim 23,
 wherein said first test signal, said second test signal and said third test signal have a low frequency, an intermediate frequency and a high frequency, respectively.

27. A magnetic recording and reproducing apparatus automatically adjustable to each individual magnetic tape, comprising:
 a source for producing a plurality of test signals at different frequencies;
 a variable-gain amplifier for amplifying said test signals, said amplifier normally serving to amplify a recording signal;
 an equalizer receiving the output of said amplifier, said equalizer having a variable frequency response and normally serving to deal with said recording signal;
 a recording bias generating circuit;
 a recording transducer for a magnetic coupling with a magnetic tape, said recording transducer being supplied with the outputs of said equalizer and said recording bias generating circuit;
 a reproducing transducer for a magnetic coupling with said magnetic tape;
 a control unit for producing a bias control signal, a gain control signal and a frequency response control signal and supplying said control signals to said recording bias generating circuit, said amplifier and said equalizer, respectively but not simultaneously;

a memory in which at least preset values for said bias control signal, said gain control signal and said frequency response control signal and a reference value are stored; and an operating circuit unit arranged to receive the output of said reproducing transducer and said reference value and compare the received reproducing transducer output with said reference value, said memory being arranged to supply said preset values to said control unit and said operating circuit unit and supply the comparison output of said operating circuit unit to said control unit to renew said gain control signal and said frequency response control signal.

28. A magnetic recording and reproducing apparatus according to claim 27, in which said memory includes a plurality of RAMs and a memory select switch is provided for enabling a desired one of said RAMs according to a magnetic tape in use.

29. A magnetic recording and reproducing apparatus according to claim 28, in which said memory further includes a ROM in which predetermined values for said bias control signal, said gain control signal and said frequency response control signal are stored so that the magnetic recording and reproducing apparatus can be set for a recording operation without adjustment for instantly initiating a recording.

30. A magnetic recording and reproducing apparatus according to claim 27, further comprising means for delaying the initiation of the adjustment by a predetermined time period corresponding to the length of the leading portion of said magnetic tape.

31. A magnetic recording and reproducing apparatus according to claim 30, in which said delaying means includes a timer circuit arranged to supply a start signal to said control unit, said memory and said operating circuit unit after said predetermined time period.

32. A magnetic recording and reproducing apparatus according to claim 31, in which said timer circuit includes a monostable multivibrator.

33. A magnetic recording and reproducing apparatus according to claim 27, further comprising means connected with said reproducing transducer for detecting the recording of one of said test signals and means for initiating the adjusting operation responsive to the output of said detecting means.

34. A magnetic recording and reproducing apparatus according to claim 27, further comprising means for effecting restarting said recording and reproducing of at least one of said test signals and effecting restarting said control unit, said memory and said operating circuit unit so that said at least one of said gain control signal and frequency response control signal is renewed at least twice.

35. A method of adjusting recording conditions of a magnetic recording and reproducing apparatus to each individual magnetic tape, comprising the steps of:

(a) presetting a value for a recording control signal for the recording and reproducing apparatus;

(b) recording a test signal on a magnetic tape with said preset control signal value;

(c) reproducing said test signal from said magnetic tape;

(d) comparing said reproduced test signal with a reference value to provide an error signal; and (e) renewing said control signal in consideration of said error signal.

36. A method according to claim 35, in which steps (b)–(e) are repeated at least twice, where said preset control signal is replaced by a renewed control signal.

37. A method of adjusting recording conditions of a magnetic recording and reproducing apparatus to each individual magnetic tape, said apparatus including a variable-gain amplifier, an equalizer having a variable frequency response and a recording bias generating circuit, the method comprising the steps of:

(a) presetting a bias control signal to be fed to said recording bias generating circuit;

(b) recording a first test signal at a frequency on a magnetic tape;

(c) reproducing said first test signal from said magnetic tape;

(d) adjusting said bias control signal so as to provide a substantial maximum output for said first test signal thereby to determine an optimum bias control signal, and fixing said proper bias control signal for said bias generating circuit;

(e) presetting a gain control signal to be fed to said variable-gain amplifier;

(f) recording a second test signal on said magnetic tape;

(g) reproducing said second test signal from said magnetic tape;

(h) comparing said reproduced second test signal with a reference value to provide an error signal;

(i) renewing said preset gain control signal in consideration of said error signal;

(j) repeating steps (f)–(i) at least twice where said preset gain control signal is replaced by a renewed one; and (k) effecting steps (e)–(j) for a frequency response control signal for said equalizer where a third test signal is used.

38. A method according to claim 37, in which said first test signal is at a frequency in a range from 1 kHz–7 kHz.

39. A method according to claim 37, in which the frequency of said second test signal is higher than that of said third test signal.

* * * * *